US009622380B1

(12) United States Patent
Joshi et al.

(10) Patent No.: US 9,622,380 B1
(45) Date of Patent: Apr. 11, 2017

(54) TWO-PHASE JET IMPINGEMENT COOLING DEVICES AND ELECTRONIC DEVICE ASSEMBLIES INCORPORATING THE SAME

(71) Applicant: Toyota Motor Engineering & Manufacturing North America, Inc., Erlanger, KY (US)

(72) Inventors: Shailesh N. Joshi, Ann Arbor, MI (US); Ercan M. Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 14 days.

(21) Appl. No.: 14/870,962

(22) Filed: Sep. 30, 2015

(51) Int. Cl.
*H05K 7/20* (2006.01)
*H01L 23/473* (2006.01)

(52) U.S. Cl.
CPC ..... *H05K 7/20327* (2013.01); *H05K 7/20345* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 7,000,684 | B2 | 2/2006 | Kenny et al. | |
|---|---|---|---|---|
| 7,806,168 | B2 | 10/2010 | Upadhya et al. | |
| 8,081,461 | B2 | 12/2011 | Campbell et al. | |
| 2002/0163782 | A1* | 11/2002 | Cole | F25B 39/028 361/700 |
| 2003/0024691 | A1 | 2/2003 | Tsay et al. | |
| 2006/0048918 | A1 | 3/2006 | Nakahama | |
| 2007/0295480 | A1* | 12/2007 | Campbell | H01L 23/427 165/80.4 |
| 2008/0259566 | A1* | 10/2008 | Fried | F28D 15/0266 361/699 |

(Continued)

FOREIGN PATENT DOCUMENTS

WO 9906782 2/1999

*Primary Examiner* — Anthony Haughton
*Assistant Examiner* — Razmeen Gafur
(74) *Attorney, Agent, or Firm* — Dinsmore & Shohl LLP

(57) ABSTRACT

Two-phase jet impingement cooling devices and electronic device assemblies are disclosed. In one embodiment, a cooling device includes a manifold having a fluid inlet surface, a fluid outlet surface defining an outlet manifold, and a fluid outlet. The fluid inlet surface includes an inlet channel fluidly coupled to a first jet region and a second jet region each including a plurality of jet orifices and a plurality of surface features extending from the fluid inlet surface. A target plate is coupled to the fluid outlet surface of the manifold that includes a target surface, a first heat sink, and a second heat sink. A cover plate is coupled to the fluid inlet surface of the manifold, which includes a fluid inlet port fluidly coupled to the inlet channel of the manifold, and a fluid outlet port fluidly coupled to the fluid outlet of the manifold.

20 Claims, 10 Drawing Sheets

(56) References Cited

U.S. PATENT DOCUMENTS

| | | | |
|---|---|---|---|
| 2009/0284921 A1* | 11/2009 | Colgan | H01L 23/473 361/699 |
| 2010/0103614 A1* | 4/2010 | Campbell | H05K 7/20809 361/689 |
| 2010/0103619 A1* | 4/2010 | Refai-Ahmed | H01L 23/473 361/701 |
| 2010/0128431 A1* | 5/2010 | Eriksen | G06F 1/20 361/679.47 |
| 2010/0142150 A1* | 6/2010 | Campbell | H01L 23/473 361/702 |
| 2010/0157531 A1* | 6/2010 | Mason | H01Q 1/02 361/697 |
| 2010/0214740 A1* | 8/2010 | Silverstein | F28D 15/0266 361/679.52 |
| 2010/0226093 A1* | 9/2010 | Beaupre | H01L 23/3735 361/699 |
| 2010/0231250 A1* | 9/2010 | Breinlinger | G01R 1/0458 324/750.08 |
| 2010/0245179 A1* | 9/2010 | Puzella | H01Q 1/02 343/702 |
| 2010/0277868 A1* | 11/2010 | Beaupre | H01L 23/473 361/700 |
| 2010/0315782 A1* | 12/2010 | Pautsch | F28F 3/12 361/702 |
| 2010/0328888 A1* | 12/2010 | Campbell | H01L 23/4735 361/699 |
| 2011/0013359 A1* | 1/2011 | Goldrian | G06F 1/20 361/679.54 |
| 2011/0075377 A1* | 3/2011 | Paquette | H05K 7/20509 361/709 |
| 2011/0188203 A1* | 8/2011 | Smith | F21V 29/02 361/699 |
| 2013/0044432 A1* | 2/2013 | Ogata | H05K 7/20336 361/700 |
| 2013/0077246 A1* | 3/2013 | Campbell | H05K 7/2029 361/700 |
| 2013/0148305 A1* | 6/2013 | Ankireddi | H01L 23/367 361/718 |
| 2014/0029193 A1* | 1/2014 | Alshinnawi | G06F 1/20 361/679.47 |
| 2014/0085823 A1* | 3/2014 | Campbell | H05K 7/20236 361/701 |
| 2014/0126142 A1* | 5/2014 | Dean | G06F 1/20 361/679.47 |
| 2014/0146467 A1* | 5/2014 | Campbell | H05K 7/20236 361/679.53 |
| 2014/0198453 A1* | 7/2014 | Zhang | H01L 23/473 361/699 |
| 2014/0204534 A1* | 7/2014 | Choudhury | G06F 1/206 361/702 |
| 2014/0240930 A1* | 8/2014 | Arvelo | H05K 7/2039 361/721 |
| 2014/0293542 A1* | 10/2014 | Vetrovec | H01L 23/473 361/699 |

* cited by examiner

TWO-PHASE JET IMPINGEMENT COOLING DEVICES AND ELECTRONIC DEVICE ASSEMBLIES INCORPORATING THE SAME

TECHNICAL FIELD

The present specification generally relates to cooling devices and, more particularly, to two-phase, jet impingement cooling devices for cooling heat generating devices.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. For example, jet impingement may be used to cool a heat generating device by directing impingement jets of cooling fluid onto the heat generating device or a target surface that is thermally coupled to the heat generating device. Additionally, jet impingement may also be combined with two-phase cooling, where the heat generating device is cooled by the phase change of the coolant fluid from a liquid to a vapor.

However, as the operating temperature of heat generating devices increases, more efficient cooling devices may be needed. Non-uniform velocity of impingement jets of cooling fluid may provide for non-uniform cooling of the heat generating devices. Additionally, cooling fluid that does not fully change from a liquid to a vapor may limit the efficiency of the cooling device.

Accordingly, a need exists for alternative cooling devices that provide uniform fluid flow through jet orifices with low flow resistance as well as efficient phase change of cooling fluid from a liquid to a vapor.

SUMMARY

In one embodiment, a cooling device includes a manifold having a fluid inlet surface, a fluid outlet surface defining an outlet manifold, and a fluid outlet. The fluid outlet surface is opposite the fluid inlet surface. The fluid inlet surface includes an inlet channel fluidly coupled to a first jet region and a second jet region. The first jet region and the second jet region each include a plurality of jet orifices and a plurality of surface features extending from the fluid inlet surface. An individual surface feature of the plurality of surface features is positioned adjacent an individual jet orifice of the plurality of jet orifices. The first jet region and the second jet region are symmetrical about a line disposed in a center of the inlet channel. The fluid outlet is fluidly coupled to the outlet manifold. The cooling device further includes a target plate coupled to the fluid outlet surface of the manifold. The target plate includes a target surface, a first heat sink at the target surface, and a second heat sink at the target surface. The first heat sink is aligned with the first jet region of the manifold, and the second heat sink is aligned with the second jet region. The cooling device also includes a cover plate coupled to the fluid inlet surface of the manifold. The cover plate includes a fluid inlet port fluidly coupled to the inlet channel of the manifold, and a fluid outlet port fluidly coupled to the fluid outlet of the manifold.

In another embodiment, a cooling device includes a manifold having a fluid inlet surface, a fluid outlet surface defining an outlet manifold, and a fluid outlet. The fluid inlet surface includes an inlet channel fluidly coupled to a jet region. The jet region includes a plurality of jet orifices and a plurality of surface features extending from the fluid inlet surface. An individual surface feature of the plurality of surface features is positioned adjacent an individual jet orifice of the plurality of jet orifices. The fluid outlet is fluidly coupled to the outlet manifold. The cooling device further includes target plate coupled to the fluid outlet surface of the manifold. The target plate includes a target surface and a heat sink at the target surface that is aligned with the jet region of the manifold. The heat sink includes one or more walls defining a central impingement region, and a plurality of channels extending through the one or more walls. The cooling device also includes a cover plate coupled to the fluid inlet surface of the manifold. The cover plate includes a fluid inlet port fluidly coupled to the inlet channel of the manifold, and a fluid outlet port fluidly coupled to the fluid outlet of the manifold.

In yet another embodiment, an electronic device assembly includes a manifold having a fluid inlet surface, a fluid outlet surface defining an outlet manifold, and a fluid outlet. The fluid outlet surface is opposite the fluid inlet surface. The fluid inlet surface includes an inlet channel fluidly coupled to a first jet region and a second jet region. The first jet region and the second jet region each include a plurality of jet orifices and a plurality of surface features extending from the fluid inlet surface. An individual surface feature of the plurality of surface features is positioned adjacent an individual jet orifice of the plurality of jet orifices. The first jet region and the second jet region are symmetrical about a line disposed in a center of the inlet channel. The fluid outlet is fluidly coupled to the outlet manifold. The electronic device assembly further includes a target plate coupled to the fluid outlet surface of the manifold. The target plate includes a target surface, a first heat sink at the target surface, and a second heat sink at the target surface. The first heat sink is aligned with the first jet region of the manifold, and the second heat sink is aligned with the second jet region. The electronic device assembly also includes a cover plate coupled to the fluid inlet surface of the manifold. The cover plate includes a fluid inlet port fluidly coupled to the inlet channel of the manifold, and a fluid outlet port fluidly coupled to the fluid outlet of the manifold. The electronic device assembly further includes a first electronic device and a second electronic device that are thermally coupled to the heat receiving surface such that the first electronic device and the second electronic device are opposite the first heat sink and the second heat sink, respectively.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION

Referring generally to the figures, embodiments of the present disclosure are directed to cooling devices and, more particularly, to two-phase jet impingement cooling devices for cooling heat generating devices. The cooling devices described herein may be useful in cooling heat generating devices such as power electronic devices. As an example and not a limitation, the cooling devices described herein may be utilized to cool power electronic devices found in inverter circuits employed by electric or hybrid-electric vehicles. Such power electronic devices, such as silicon carbide electronic devices, may operate at relatively high operating temperatures (e.g., 200° C. and greater). The cooling devices described herein provide impingement jets of cooling fluid that strike a target surface to which the heat generating device is thermally coupled. Thermal energy is transferred from the target surface to the cooling fluid that impinges the target surface. The cooling fluid is heated by the heat generating device such that it changes phase from a liquid to a vapor, thereby further cooling the heat generating device.

The cooling devices described herein include a manifold having an inlet surface that provides an inlet channel and two symmetrical jet impingement regions. The two jet impingement regions each have a plurality of jet orifices through which cooling fluid flows as impingement jets toward a heat sink and target surface. Each of the jet impingement regions have a perimeter wall and a plurality of surface features that are optimized to uniformly distribute the flow of cooling fluid across the plurality of jet orifices with relatively low flow resistance (i.e., minimal pressure drop). Optimized heat sink configurations that promote phase change of the cooling fluid are also described herein. In some embodiments, porous surfaces are provided at the target surface and/or heat sink to further promote phase change of the cooling fluid. The compact, multi-layer design of the cooling devices described herein minimizes the overall height of the cooling device and thus reduces the volume needed for efficient high-performance cooling.

Various embodiments of cooling devices and electronic device assemblies are described in detail herein.

Figure 1:
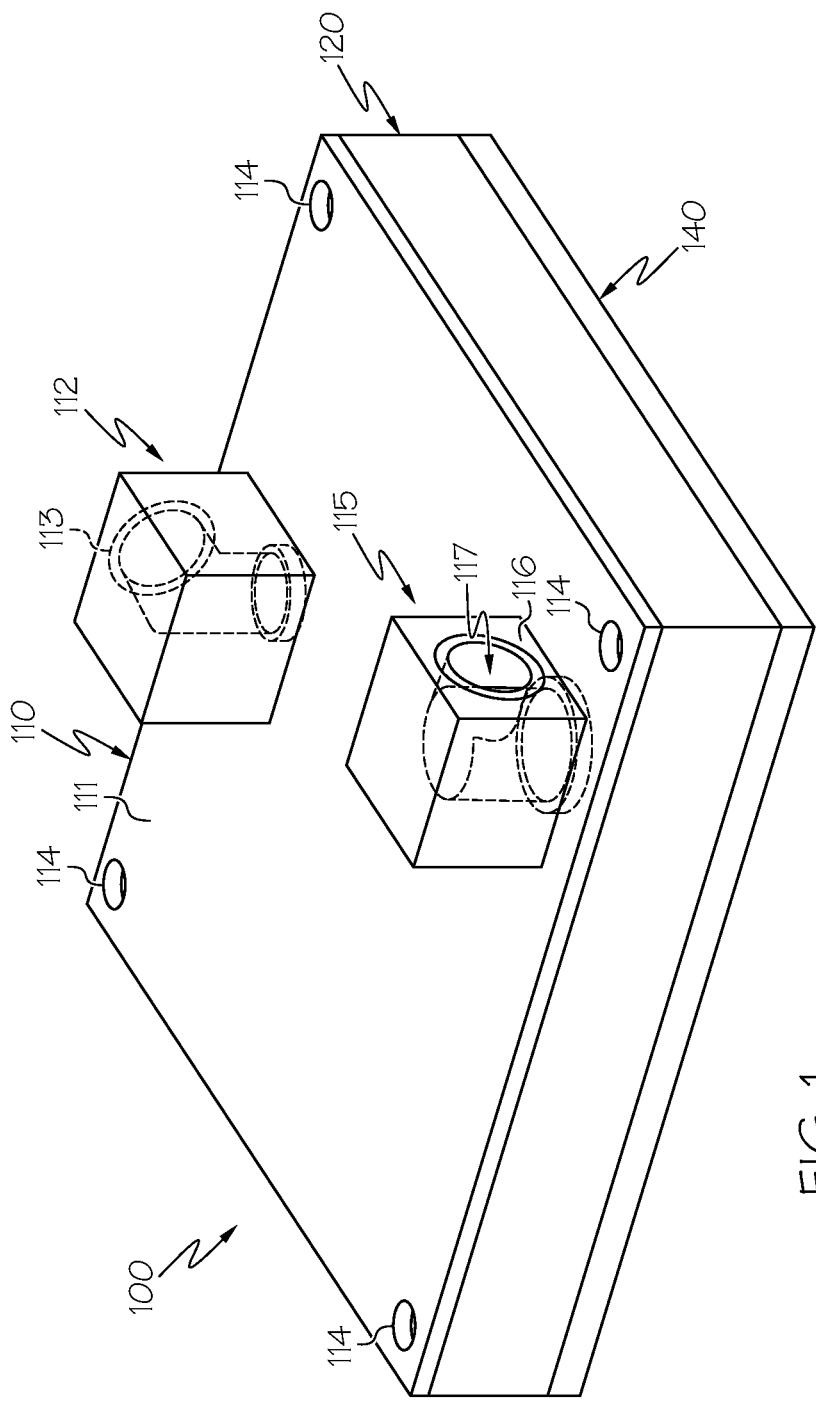
FIG. 1 schematically depicts a perspective view of an example cooling device according to one or more embodiments described and illustrated herein.

Referring now to FIG. 1, an example cooling device 100 is schematically depicted in a perspective view. The example cooling device 100 may be included as a component in an electronic assembly for the purpose of cooling one or more power electronic devices, for example. However, it should be understood that the cooling device 100 may be utilized in applications other than electronics applications.

The cooling device depicted in FIG. 1 generally includes a cover plate 110, a manifold 120, and a target plate 140. The cover plate 110 is coupled to a fluid inlet surface of the manifold 120, and the target plate 140 is coupled to a fluid outlet surface of the manifold. In some embodiments, the cover plate 110, the manifold 120 and the target plate 140 may be coupled together by through holes 114 and mechanical fasteners (e.g., bolts, nuts, screws, and the like (not shown)). However, it should be understood that the cover plate 110, the manifold 120 and the target plate 140 may be coupled together by other means, such as by soldering, brazing, and the like.

An upper surface 111 of the example cover plate 110 includes an inlet port 115 and an outlet port 112 extending therefrom. In the illustrated embodiment, the inlet port 115 includes an inlet surface 116 having a fluid inlet passage 117 opening disposed therein. The example fluid inlet passage 117 has a ninety-degree turn such that cooling fluid entering the fluid inlet passage 117 exits the inlet port 115 into the manifold 120 at an angle that is transverse to the upper surface 111 of the cover plate 110 (e.g., orthogonal to the upper surface 111 of the cover plate 110).

A fluid outlet passage 113 is disposed within the fluid outlet port 112. The fluid outlet passage 113 may also have a ninety-degree turn in some embodiments. As described in more detail below, the fluid outlet port 112 is fluidly coupled to the fluid outlet surface of the manifold 120.

Although not depicted in FIG. 1, the fluid inlet port 115 and the fluid outlet port 112 may include fluid couplings to fluidly couple fluid lines for introducing and removing cooling fluid to and from the cooling device 100.

Figure 2:
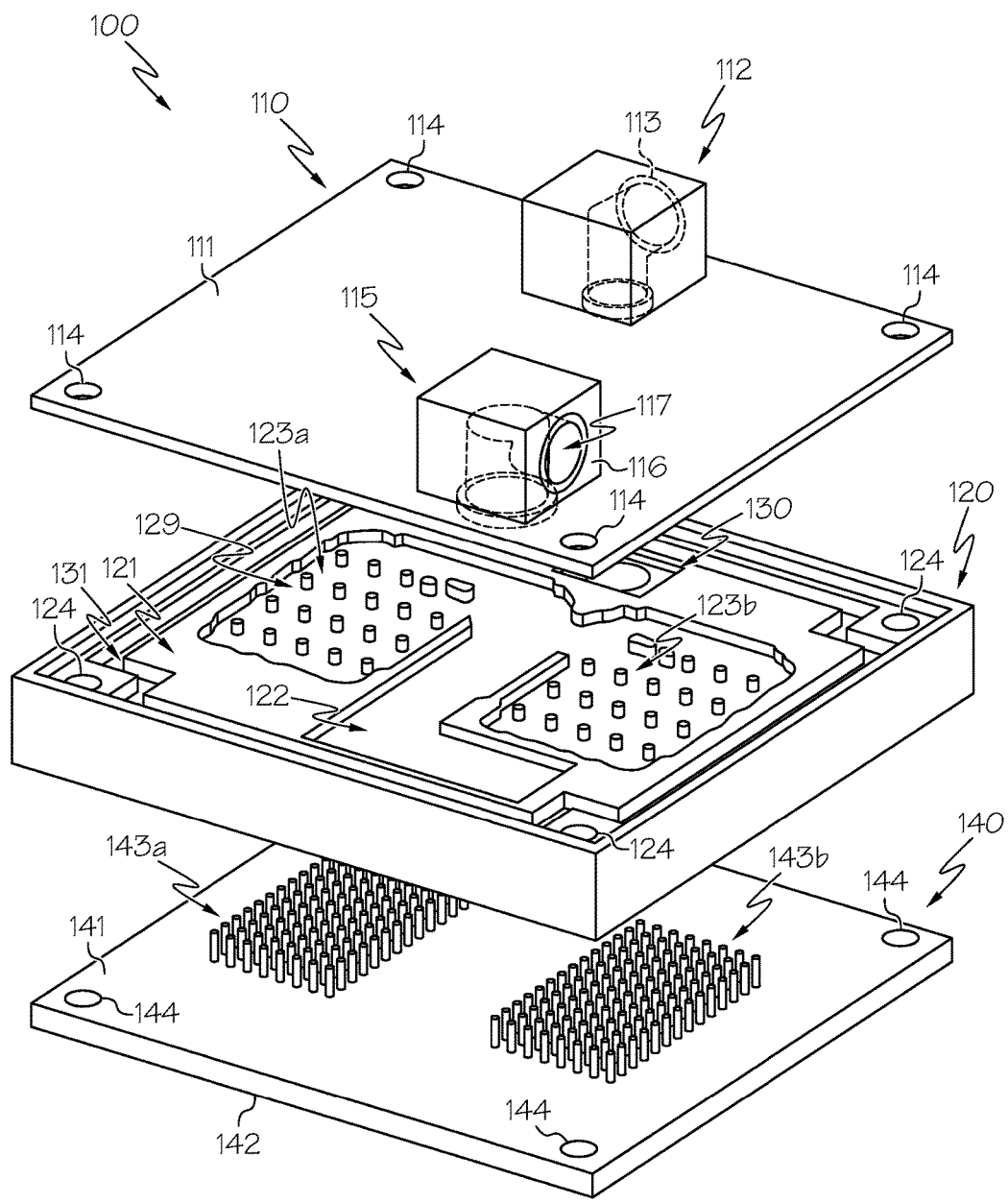
FIG. 2 schematically depicts an exploded perspective view of the example cooling device depicted in FIG. 1 according to one or more embodiments described and illustrated herein.

Referring now to FIG. 2, an exploded view of the example cooling device 100 depicted in FIG. 1 is illustrated. As stated above, the cover plate 110 is coupled to a fluid inlet surface 121 of the manifold 120, and the target plate 140 is coupled to a fluid outlet surface 125 (FIG. 4) of the manifold 120.

The manifold 120 may include through holes 124 or other mechanical features to assist in coupling the components together.

The manifold 120 may be fabricated from any suitable thermally conductive material, such as, without limitation, aluminum, copper, and thermally conductive polymers. It should be understood that other materials may also be utilized.

Figure 3:
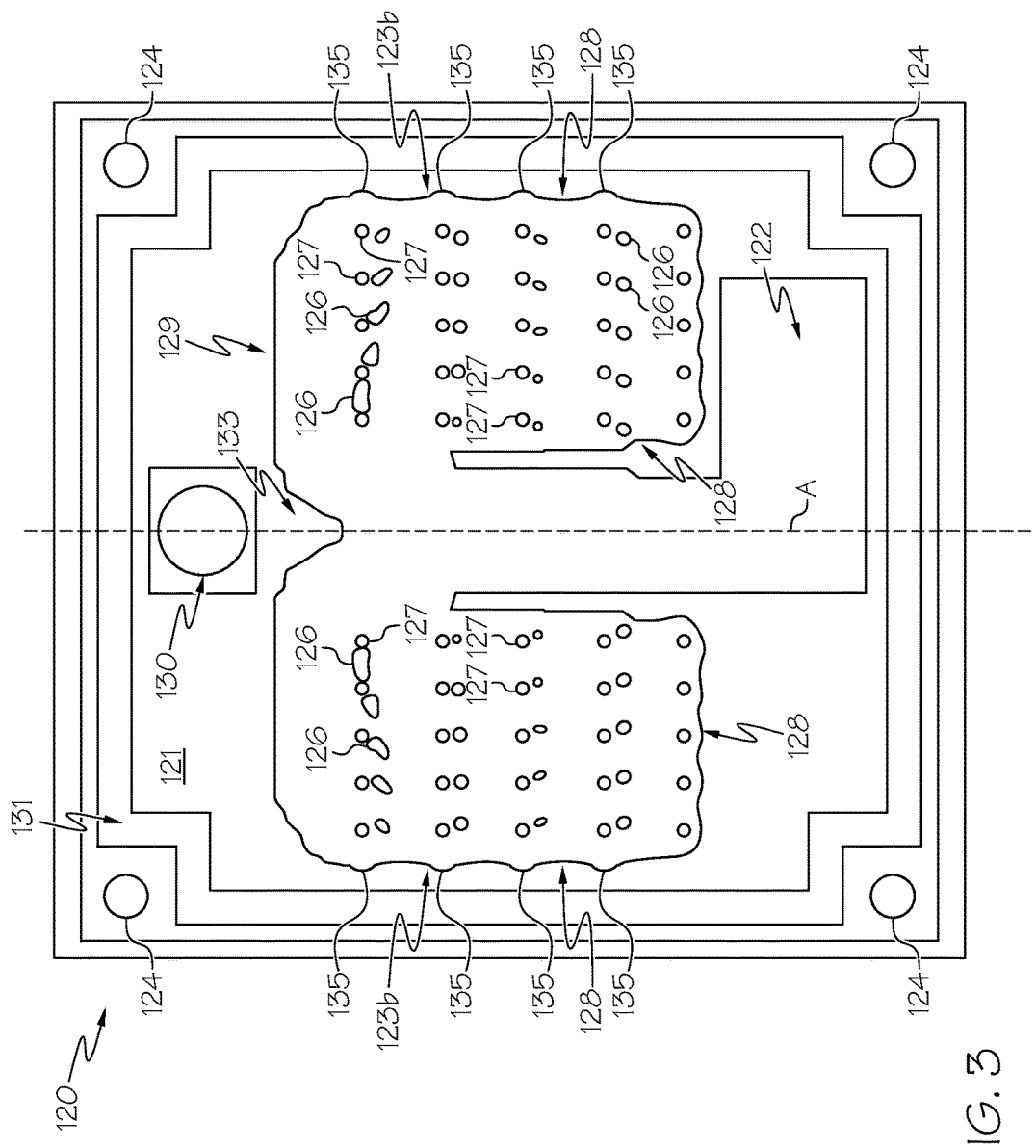
FIG. 3 schematically depicts an example fluid inlet surface of a manifold of a cooling device according to one or more embodiments described and illustrated herein.

Referring to both FIG. 2 and FIG. 3, the fluid inlet surface 121 of the manifold 120 defines an inlet manifold 129. Particularly, the inlet manifold 129 of the illustrated embodiment includes an inlet channel 122, a first jet region 123a, and a second jet region 123b that are configured as recesses within the fluid inlet surface 121. The example fluid inlet surface 121 further includes a gasket groove 131 around a perimeter of the fluid inlet surface 121 operable to receive a gasket (not shown) to seal the cover plate 110 to the fluid inlet surface 121 of the manifold 120.

The fluid inlet channel 122 is fluidly coupled to the fluid inlet passage 117 of the inlet port 115, and directs cooling fluid from the inlet port 115 toward the first jet region 123a and the second jet region 123b. In the illustrated embodiment, the fluid inlet channel 122 includes a ninety-degree turn such that it has an "L" shape. However, it should be understood that, in other embodiments, the fluid inlet channel 122 may possess other shapes, such as a straight channel with no turns, for example.

The first jet region 123a and the second jet region 123b are each fluidly coupled to an end of the fluid inlet channel 122 such that each receives cooling fluid from the fluid inlet channel 122. In the illustrated embodiment, each of the first and second jet regions 123a, 123b have a non-linear perimeter wall 128 that provide lobe-shaped jet regions extending from the end of the fluid inlet channel 122 and back toward an edge of the manifold 120 proximate the inlet port 115. The perimeter wall 128 also defines a protrusion 133 that extends in a direction toward the fluid inlet channel 122. As described in more detail below, the protrusion 133 is configured to equally distribute cooling fluid to both the first jet region 123a and the second jet region 123b.

Each of the first jet region 123a and the second jet region 123b includes a plurality of jet orifices 127 that receives the cooling fluid from the fluid inlet channel 122 and directs it toward the target plate 140 as a plurality of impingement jets of cooling fluid. In the illustrated embodiment, the plurality of jet orifices 127 of the first jet region 123a and the second jet region 123b is configured as an array of jet orifices 127. However, it should be understood that embodiments are not limited thereto. The jet orifices 127 may be arranged in an arbitrary manner, for example.

Each of the first jet region 123a and the second jet region 123b include a plurality of surface features 126 extending from the fluid inlet surface 121. Each individual surface feature 126 is positioned adjacent an individual jet orifice 127. The shape of the perimeter wall 128, and the shape and placement of the individual surface features 126, are optimized to provide for substantially uniform flow of cooling fluid through each of the jet orifices 127. For example, the size of surface features 126 closer to fluid inlet channel 122 may be larger than surface features 126 located farther away from fluid inlet channel 122 because of the greater volume of cooling fluid near the fluid inlet channel 122 than further away. The perimeter wall 128 has a non-linear configuration to optimize cooling fluid flow toward the plurality of jet orifices 127. Particularly, the perimeter wall 128 has a convex region 135 adjacent to each jet orifice 127 positioned as a perimeter jet orifice of the plurality of jet orifices.

The shape of the perimeter wall 128 and the shape and placement of the plurality of surface features 126 are optimized to ensure uniform flow distribution as well as to minimize pressure drop. Computerized methods of determining the optimized shape of the perimeter wall 128 and plurality of surface features 126 include, but are not limited to, those described in U.S. Pat. No. 8,516,831, which is hereby incorporated by reference in its entirety. In the illustrated embodiment, the features of the first jet region 123a and the second jet region 123b are symmetrical about a center line A of the fluid inlet channel 122.

Figure 4:
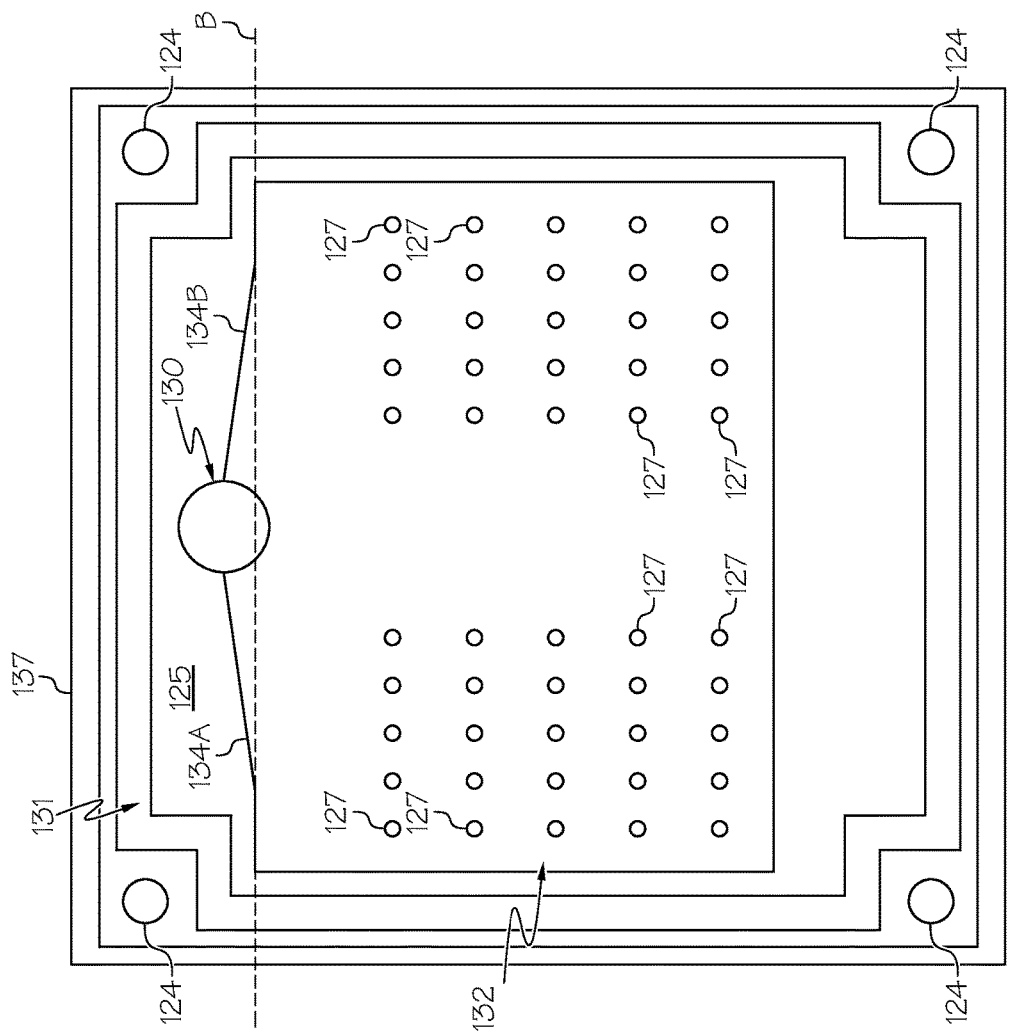
FIG. 4 schematically depicts an example fluid outlet surface of a manifold of a cooling device according to one or more embodiments described and illustrated herein.

Referring now to FIGS. 2 and 4, an outlet manifold 132 is configured as a recess in the fluid outlet surface 125. The outlet manifold 132 is defined by an outlet manifold wall 134. The plurality of jet orifices 127 of each of the first jet region 123a and the second jet region 123b extend fully through the manifold 120 and are positioned within the outlet manifold 132. The fluid outlet surface 125 further includes a gasket groove 131 to receive a gasket (not shown) for sealing the fluid outlet surface with respect to the target plate 140, A fluid outlet 130 extends fully through the manifold 120 and is fluidly coupled to the outlet manifold 132. Referring briefly to FIG. 2, the fluid outlet 130 is fluidly isolated from the fluid inlet channel 122, the first jet region 123a, and the second jet region 123b.

The fluid outlet 130 is disposed between a first wall 134a and a second wall 134b (each a portion of the collective outlet manifold wall 134). In the illustrated embodiment, the first wall 134a and the second wall 134b are angled outwardly away from a central region of the outlet manifold 132 by an angle $\theta$ with respect to line B that is parallel to edge 137 of the manifold 120. The angled first wall 134a and second wall 134b may assist in directing cooling fluid toward the fluid outlet 130 so that it may exit the cooling device 100 through the outlet port 112.

Referring once again to FIG. 2, the target plate 140 is coupled to the fluid outlet surface of the manifold 120. The target plate 140 has a target surface 141 that receives the impingent jets of cooling fluid and a heat receiving surface 142 at which one or more heat generating devices are coupled. The target plate 140 is fabricated from a thermally conductive material such as, without limitation, aluminum and copper.

The example target plate 140 depicted in FIG. 2 comprises a first array of pin-fins 143a (i.e., a first heat sink) and a second array of pin-fins 143b (i.e., a second heat sink) extending from the target surface 141. When the cooling device 100 is assembled, the first array of pins fins 143a is aligned with the plurality of jet orifices 127 of the first jet region 123a and the second array of pins fins 143b is aligned with the plurality of jet orifices 127 of the second jet region 123b. In this manner, impingement jets of cooling fluid from the pluralities of jet orifices 127 impingement the target surface 141 at the first array of pin-fins 143a and the second array of pin-fins 143b.

Figure 5A:
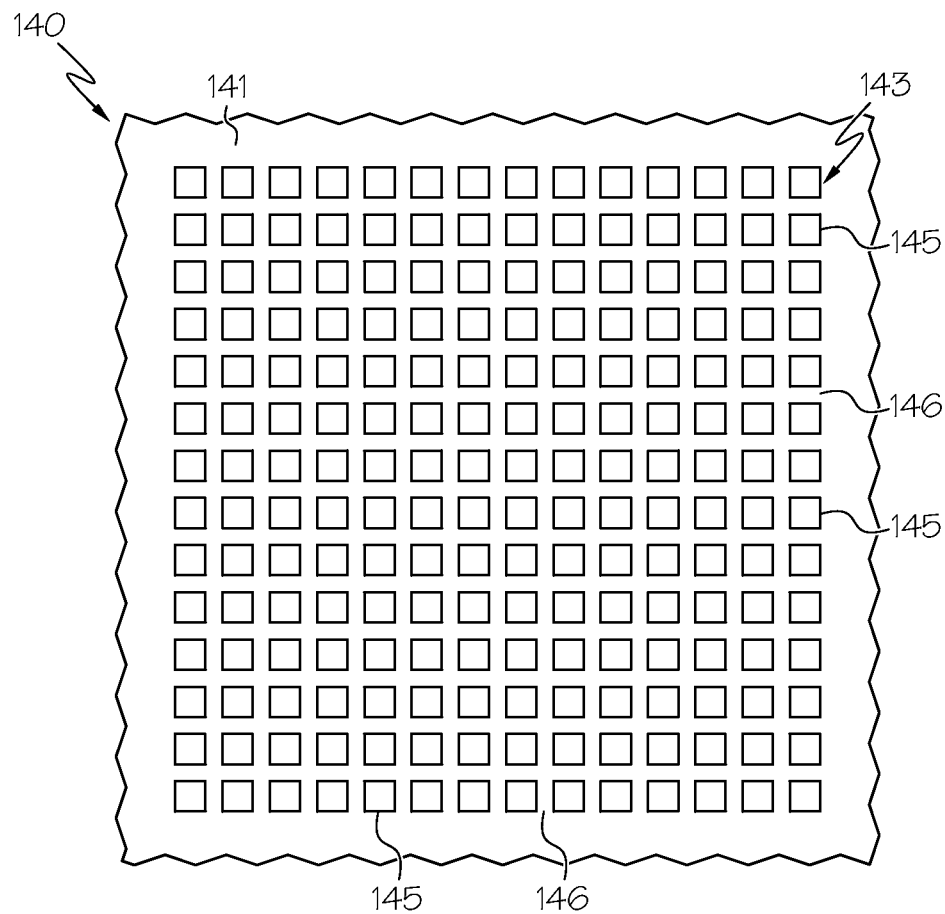
FIG. 5A schematically depicts a top-down view of a portion of a target plate and an example pin fin heat sink according to one or more embodiments described and illustrated herein.
Figure 5B:
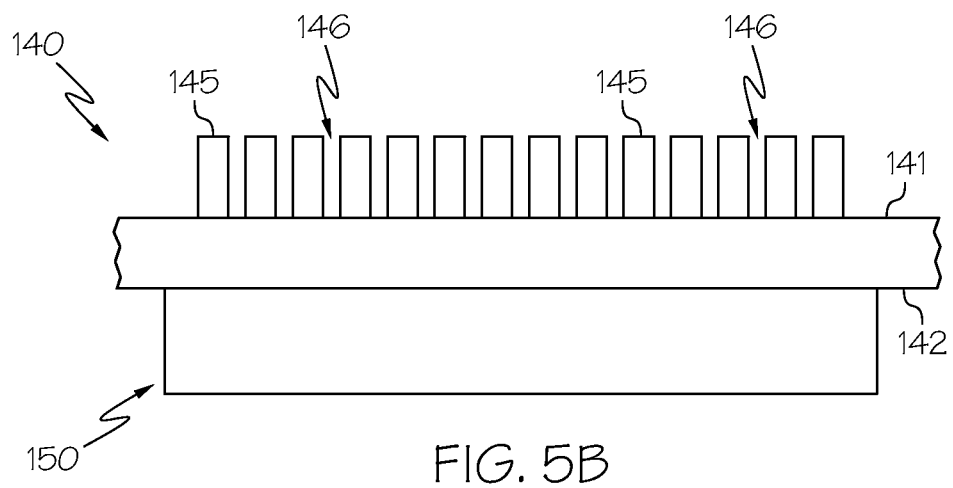
FIG. 5B schematically depicts a side elevation view of the partial target plate and the pin-fin heat sink depicted in FIG. 5A.

Referring now to FIGS. 5A and 5B, a top view and a side view of an array of pin-fins 143 are schematically depicted (i.e., a pin-fin heat sink). Each pin-fin 145 is configured as a feature, such as a pillar, that extends from the target surface 141 of the target plate 140. The pin-fin 145 may take on any shape in cross-section, such as rectangular, circular, elliptical, or the like. The pin-fins 145 are separated from one another by a gap 146. The size of the pin-fins 145 and size of the gap 146 are not limited by this disclosure. In embodiments, the top of the pin-fins 145 may contact the fluid outlet surface 125 of the manifold 120.

As shown in FIG. 5B, a heat generating device 150 is thermally coupled to the heat receiving surface 142 of the target plate 140 opposite from the array of pin-fins 143 (e.g., by transient liquid phase bonding, brazing, solder, or the like). The heat generating device 150 may be any component that generates heat. As a non-limiting example, the heat generating device 150 may be an electronic device, such as a power semiconductor device. Power semiconductor devices may include, without limitation, insulated-gate bipolar transistors, metal-oxide field-effect transistors, and bi-polar transistors. In some embodiments, the heat generating device(s) may be silicon carbide devices, which operate at relatively high operating temperatures (e.g., greater than 200° C.). As a further non-limiting example, the cooling devices described herein may be implemented in an inverter circuit in an electric or hybrid-electric vehicle to cool power semiconductors by two-phase and jet-impingement cooling. The combination of a cooling device 100 and one or more power electronic devices 150 is referred to herein as an electronic device assembly.

Heat generated by the heat generating device 150 passes through the target plate 140 and the array of pin-fins 143, where it is transferred to the cooling fluid as the impingement jets strike the array of pin-fins 143. The array of pin-fins 143 increases the surface area of contact with the cooling fluid, thereby increasing heat transfer from the target plate 140 to the cooling fluid. At high heat fluxes, nucleate boiling occurs on the target surface 141 and the array of pin-fins 143 creating areas of two-phase heat transfer. In some embodiments, the target surface 141 and/or the array of pin-fins 143 has a porous surface to enhance nucleation of the cooling fluid. The porous surfaces may be provided by a porous coating, for example, which may be made of copper, aluminum or any other thermally conductive materials. In some embodiments, the porous surface is provided by chemically etching the surfaces of the target surface 141 and/or the array of pin-fins 143.

Figure 6A:
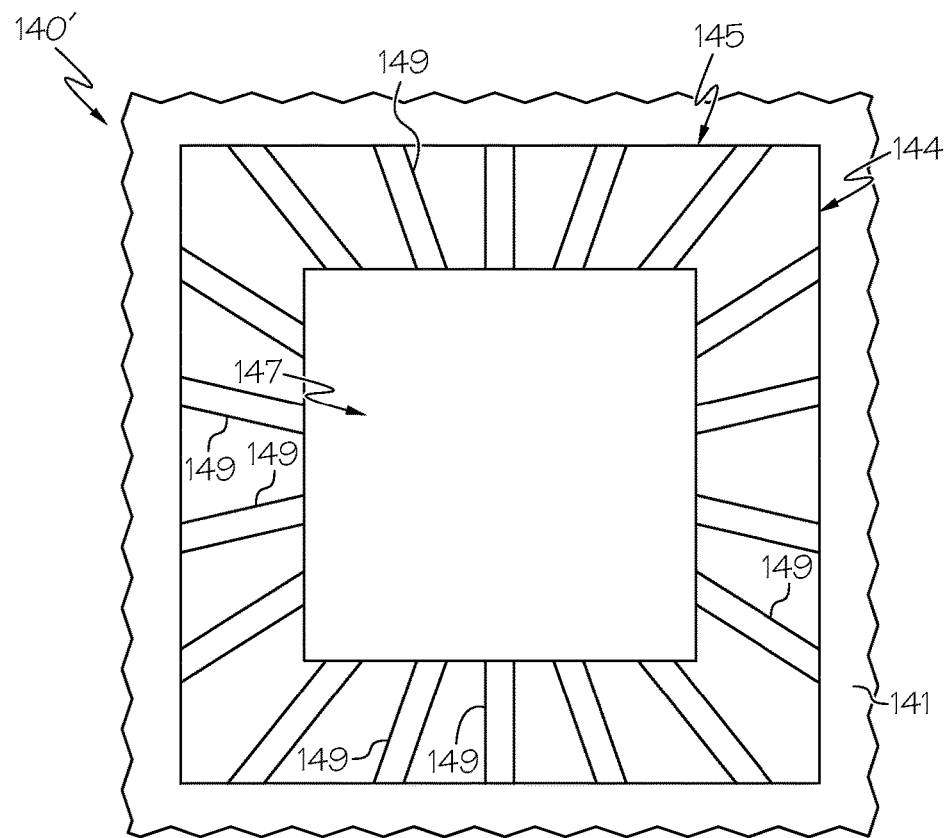
FIG. 6A schematically depicts a top-down view of a portion of a target plate and an example heat sink having open channels according to one or more embodiments described and illustrated herein.
Figure 6B:
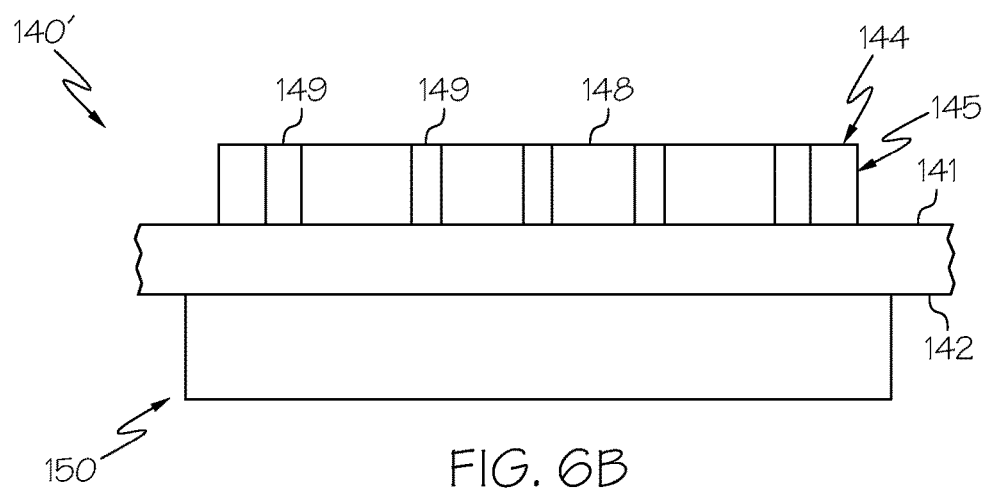
FIG. 6B schematically depicts a side elevation view of the partial target plate and the heat sink depicted in FIG. 6A.

Embodiments described herein are not limited to pinned heat sinks as illustrated in FIGS. 2, 5A and 5B. FIGS. 6A and 6B depict a portion of an example target plate 140' having another example heat sink 144. FIG. 6A is a top-down view of the example heat sink 144 on the target plate 140', while FIG. 6B is a side elevation view of the same. The example heat sink 144 has one or more walls 145 that define a central impingement region 147. Although the example heat sink 144 is depicted as having four walls 145 providing a square-shaped central impingement region 147, embodiments are not limited thereto. For example, the one or more walls may provide for a central impingement region 147 having a circular shape, an elliptical shape, a triangular shape, or other shape.

One or more heat generating devices 150 are thermally coupled to a heat receiving surface 142 of the target plate 140' opposite the one or more heat sinks 144. One or more heat sinks 144 are positioned on the target plate 140' (e.g., two heat sinks) such that the one or more heat sinks 144 are aligned with one or more arrays of jet orifices 127 of the manifold 120. Accordingly, impingement jets of cooling fluid strike the central impingement region 147. In embodiments, an upper surface 148 of the one or more walls 145 contacts the fluid outlet surface 125 of the manifold 120 to confine the cooling fluid within the central impingement region 147 after impingement. This confinement of the cooling fluid within the central impingement region 147 may promote the phase change of the cooling fluid from a liquid to a vapor in response to heat flux provided by the heat generating device.

The example heat sink 144 shown in FIGS. 6A and 6B further includes open channels 149 positioned within the one or more walls 145. The channels 149 of the illustrated embodiment are configured as grooves through the one or more walls 145. Cooling fluid, in vapor and/or liquid form, efficiently exits the central impingement region 147 through the open channels 149.

As stated above with respect to the pin-fin heat sinks 143, the heat sink 144 depicted in FIGS. 6A and 6B may be smooth or have a porous surface to promote nucleate boiling of the cooling fluid. The porous surface may be provided by a coating, an etching process, or any other process or material. It should be noted that the heat sink 144 may be made of any thermally conductive material, such as copper or aluminum, for example.

Figure 7A:
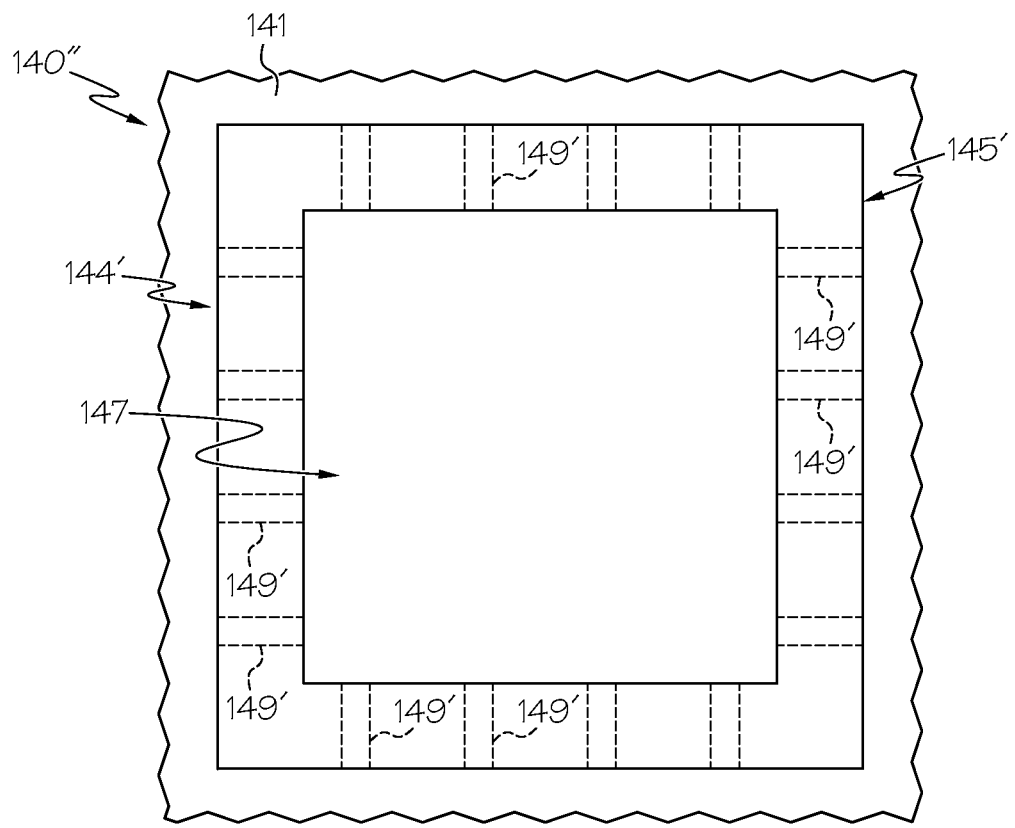
FIG. 7A schematically depicts a top-down view of a portion of a target plate and an example heat sink having closed channels according to one or more embodiments described and illustrated herein.
Figure 7B:
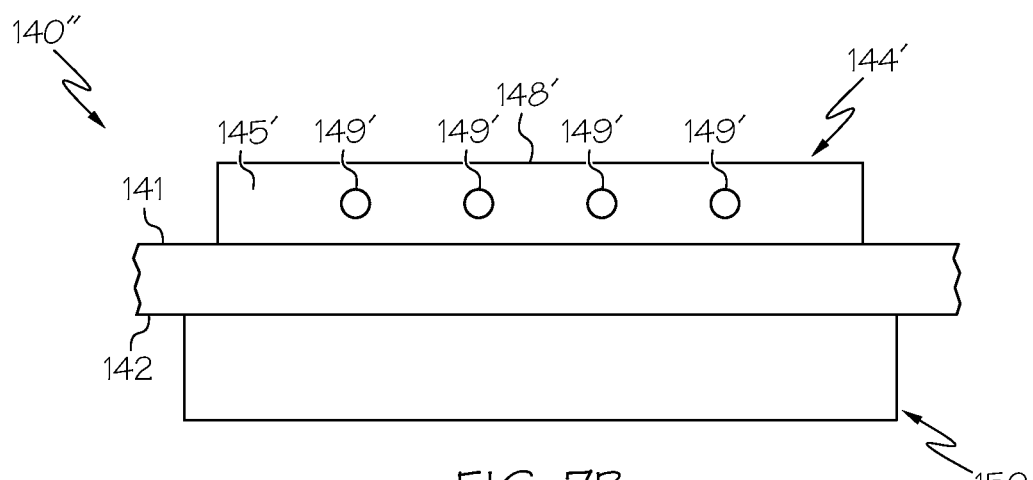
FIG. 7B schematically depicts a side elevation view of the partial target plate and the heat sink depicted in FIG. 7A.

FIGS. 7A and 7B depict a partial view of another example target plate 140" comprising one or more heat sinks 144'. FIG. 7A is a top-down view of the example heat sink 144' on the target plate 140", while FIG. 7B is a side elevation view of the same. The example heat sink 144' has one or more walls 145' that define a central impingement region 147. Although the example heat sink 144' is depicted as having four walls 145' providing a square shaped central impingement region 147, embodiments are not limited thereto. For example, the one or more walls may provide for a central impingement region 147 having a circular shape, an elliptical shape, a triangular shape, or other shape.

As stated above with respect to FIGS. 6A and 6B, one or more heat generating devices 150 are thermally coupled to a heat receiving surface 142' of the target plate 140" opposite the one or more heat sinks 144'. One or more heat sinks 144' are positioned on the target plate 140" (e.g., two heat sinks) such that the one or more heat sinks 144' are aligned with one or more arrays of jet orifices 127 of the manifold 120. Accordingly, impingement jets of cooling fluid strike the central impingement region 147. In embodiments, an upper surface 148' of the one or more walls 145' contacts the fluid outlet surface 125 of the manifold 120 to confine the cooling fluid within the central impingement region 147 after impingement. This confinement of the cooling fluid within the central impingement region 147 may promote the phase change of the cooling fluid from a liquid to a vapor in response to heat flux provided by the heat generating device 150.

The example heat sink 144' shown in FIGS. 7A and 7B further includes closed channels 149' positioned within the one or more walls 145'. The channels 149' of the illustrated embodiment are configured as bores (i.e., through holes) positioned through the one or more walls 145'. Cooling fluid, in vapor and/or liquid form, efficiently exits the central impingement region 147 through the closed channels 149'.

As stated above with respect to the heat sink 144 depicted in FIGS. 6A and 6B, the heat sink 144' depicted in FIGS. 7A and 7B may be smooth or have a porous surface to promote nucleate boiling of the cooling fluid. The porous surface may be provided by a coating, an etching process, or any other process or material. It should be noted that the heat sink 144' may be made of any thermally conductive material, such as copper or aluminum, for example.

The effect of heat flux with respect to the heat transfer coefficient and pressure drop for three cooling devices as shown in FIGS. 1 and 2 were evaluated by computer simulation. One simulated cooling device included two pin-fin heat sinks 143 (see FIGS. 5A and 5B), another simulated cooling device included two open channel heat sinks 144 (see FIGS. 6A and 6B), and another simulated cooling device included two closed channel heat sink 144' (see FIGS. 7A and 7B).

Figure 8:
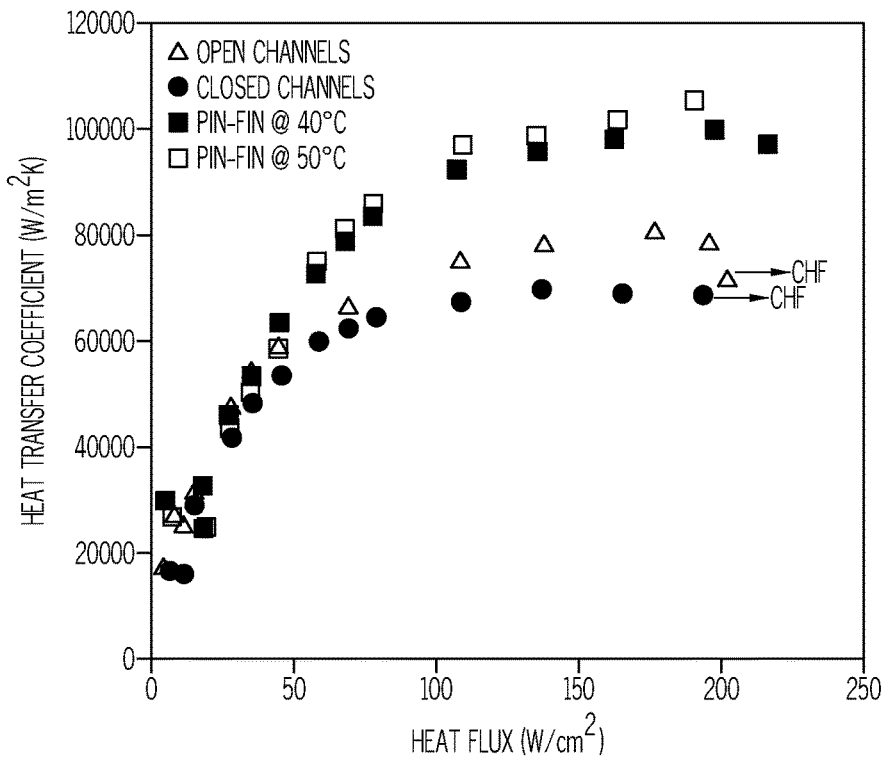
FIG. 8 graphically depicts the heat transfer coefficient with respect to heat flux for a plurality of different heat sinks of simulated cooling devices according to one or more embodiments described and illustrated herein.

FIG. 8 graphically depicts the heat transfer coefficient between the three types of heat sinks using R-245fa as the cooling fluid. The inlet temperature of the cooling fluid was 40° C. except where noted. It is noted that the pin-fin heat sinks did not reach critical heat flux.

Figure 9:
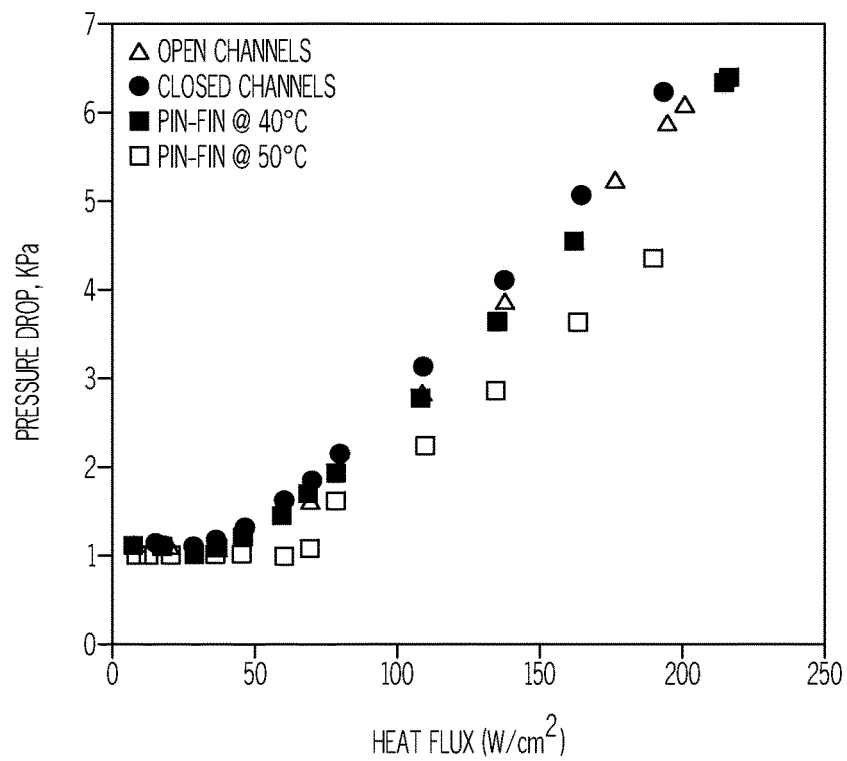
FIG. 9 graphically depicts a simulation of the pressure drop with respect to heat flux within a cooling device for a plurality of different heat sinks of simulated cooling devices according to one or more embodiments described and illustrated herein.

FIG. 9 graphically depicts the pressure drop within the simulated cooling devices including the three different types of heat sinks. The cooling fluid was R-245fa. The inlet temperature of the cooling fluid was 40° C. except where noted.

Figure 10:
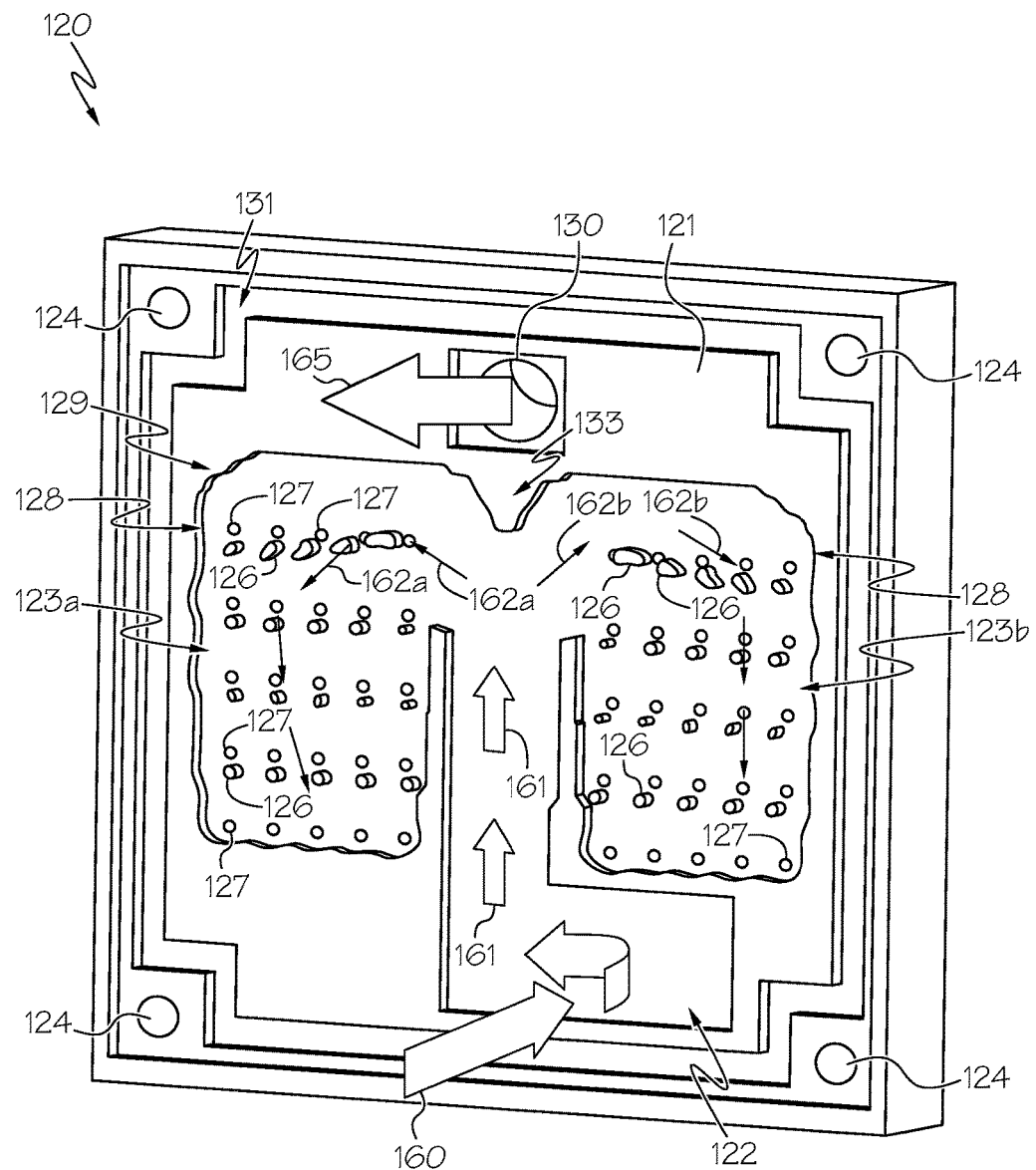
FIG. 10 schematically depicts cooling fluid flow through the fluid inlet surface of the manifold depicted in FIG. 3 according to one or more embodiments described and illustrated herein.

Referring to FIGS. 1 and 10, operation of an example cooling device 100 will now be described. Cooling fluid is introduced into the cooling device 100 by way of the inlet port 115. Any suitable cooling fluid may be utilized. Non-limiting cooling fluids include water, refrigerants, and dielectric cooling fluids. Non-limiting dielectric cooling fluids include R-245fa and HFE-7100. Other cooling fluids may be utilized. The type of cooling fluid chosen may depend on the operating temperature of the heat generating device 150 to be cooled. The inlet temperature of the cooling fluid may be regulated by one or more components upstream from the cooling device 100.

Referring now to FIG. 10, the coolant fluid enters the inlet channel 122 at the fluid inlet surface 121 of the manifold 120 as indicated by arrow 160. The cooling fluid travels through the inlet channel 122 as indicated by arrows 161, where it is then redirected into the first jet region 123a and the second jet region 123b by the protrusion 133 of the perimeter wall 128. The cooling fluid flows through the first jet region 123a and the second jet region 123b as indicated by arrows 162a and 162b. The shape of the perimeter wall 128 and the shape and position of the surface features 126 optimally route the cooling fluid toward the jet orifices 127 such that there is substantially uniform fluid flow through each jet orifice 127 within the first and second jet regions 123a, 123b. As used herein, the term "substantially uniform fluid flow" means that the fluid flow is within 10% of a theoretical calculated fluid flow for a majority of the jet orifices 127 of the cooling device 100.

Figure 11:
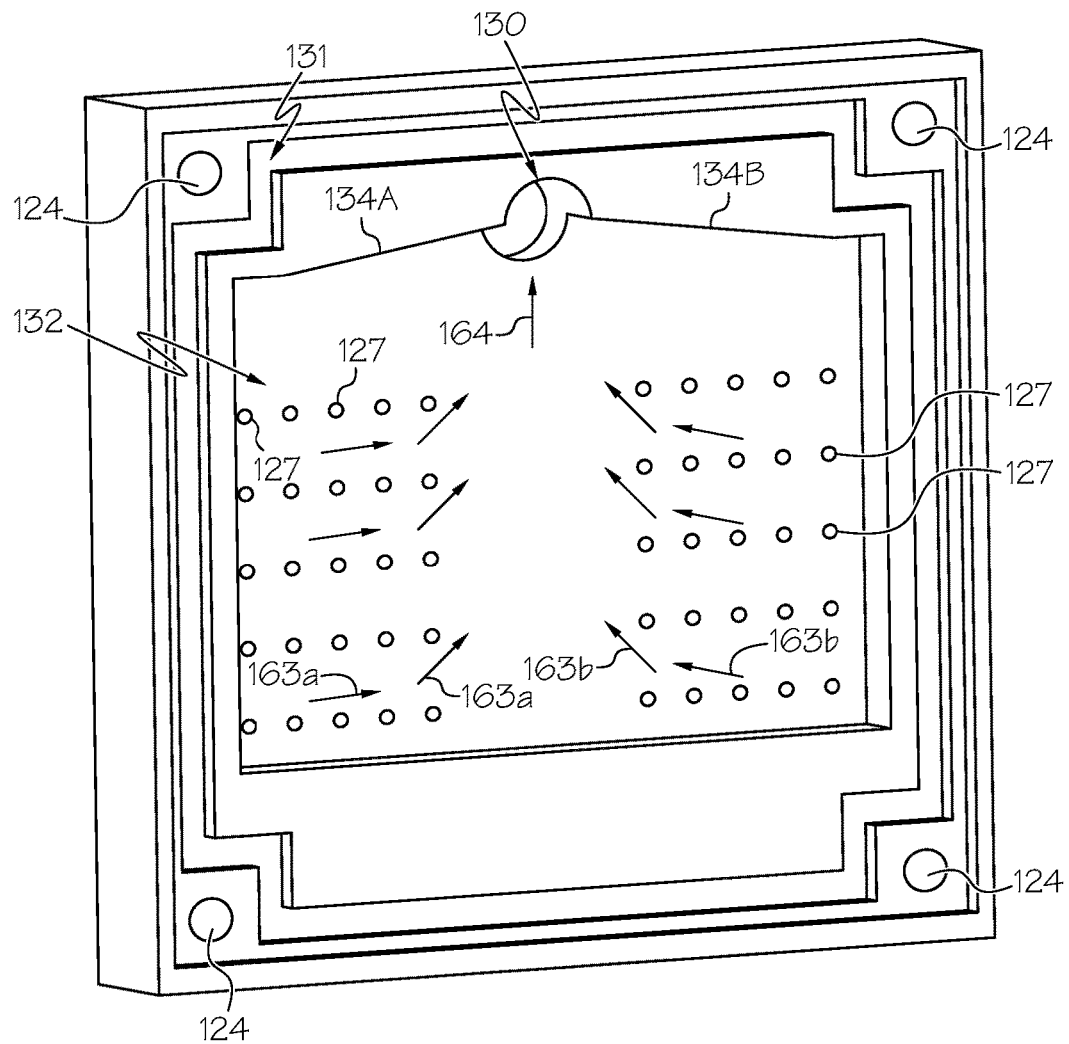
FIG. 11 schematically depicts cooling fluid flow through the fluid outlet surface of the manifold depicted in FIG. 5 according to one or more embodiments described and illustrated herein.

Referring now to FIGS. 2 and 11, the coolant fluid exits the jet orifices 127 as impingement jets that strike the target plate 140 at a heat sink 143. Heat flux created by the heat generating devices 150 coupled to the heat receiving surface 142 of the target plate 140 heats the cooling fluid such that it changes from a liquid to a vapor. Porous surfaces may be provided to provide additional nucleation sites to enhance nucleate boiling of the cooling fluid. Cooling fluid, in the form of vapor, exits the heat sink area and flows toward the fluid outlet 130 as indicated by arrows 163A, 163B. Walls 134a and 134b assist in directing the vapor toward the fluid outlet 130, where it then exits the cooling device 100 through the outlet port 112 (arrow 164).

It should now be understood that embodiments described herein are directed to two phase jet impingement, cooling devices for cooling heat generating devices, such as power semiconductor devices. A symmetrical inlet manifold having two jet orifice regions with an optimized perimeter wall and surface features ensure substantially uniform fluid flow through each impingement jet with minimal pressure drop. The target surface includes heat sinks that promote phase change of the cooling fluid from a liquid to a vapor. In embodiments, the target surface and/or the heat sinks are porous to provide additional nucleation sites.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling device comprising:
a manifold comprising a fluid inlet surface, a fluid outlet surface defining an outlet manifold, and a fluid outlet, wherein:
the fluid outlet surface is opposite the fluid inlet surface;
the fluid inlet surface comprises an inlet channel fluidly coupled to a first jet region and a second jet region;
the first jet region and the second jet region each comprise a plurality of jet orifices and a plurality of surface features extending from the fluid inlet surface;
an individual surface feature of the plurality of surface features is positioned adjacent an individual jet orifice of the plurality of jet orifices;
the first jet region and the second jet region are symmetrical about a line disposed in a center of the inlet channel; and
the fluid outlet is fluidly coupled to the outlet manifold;
a target plate coupled to the fluid outlet surface of the manifold, the target plate comprising a target surface, a first heat sink at the target surface, and a second heat sink at the target surface, wherein the first heat sink is aligned with the first jet region of the manifold, and the second heat sink is aligned with the second jet region; and
a cover plate coupled to the fluid inlet surface of the manifold, the cover plate comprising a fluid inlet port fluidly coupled to the inlet channel of the manifold, and a fluid outlet port fluidly coupled to the fluid outlet of the manifold.

2. The cooling device of claim 1, wherein each of the plurality of jet orifices of the first jet region and the plurality of jet orifices of the second jet region is arranged in an array.

3. The cooling device of claim 1, wherein the first heat sink is configured as a first array of pins and the second heat sink is configured as a second array of pins.

4. The cooling device of claim 1, wherein the fluid inlet port has a channel comprising a ninety degree turn.

5. The cooling device of claim 1, wherein:
the outlet manifold is defined by a plurality of walls;
the fluid outlet is disposed between a first wall and a second wall of the plurality of walls; and
the first wall and the second wall are angled outwardly away from a central region of the outlet manifold.

6. The cooling device of claim 1, wherein the first jet region and the second jet region are fluidly coupled to an end of the inlet channel.

7. The cooling device of claim 1, wherein the inlet channel comprises a ninety degree turn.

8. The cooling device of claim 1, wherein:
each of the first jet region and the second jet region is defined by a perimeter wall; and
the perimeter wall has a non-linear shape comprising a plurality of convex regions such that each convex region is adjacent to an individual jet orifice of the plurality of jet orifices.

9. The cooling device of claim 1, wherein the target surface, the first heat sink, and the second heat sink have a porous surface.

10. A cooling device comprising:
a manifold comprising a fluid inlet surface, a fluid outlet surface defining an outlet manifold, and a fluid outlet, wherein:
the fluid inlet surface comprises an inlet channel fluidly coupled to a jet region;
the jet region comprises a plurality of jet orifices and a plurality of surface features extending from the fluid inlet surface;
an individual surface feature of the plurality of surface features is positioned adjacent an individual jet orifice of the plurality of jet orifices; and
the fluid outlet is fluidly coupled to the outlet manifold;
a target plate coupled to the fluid outlet surface of the manifold, the target plate comprising a target surface and a heat sink at the target surface that is aligned with the jet region of the manifold, wherein the heat sink comprises one or more walls defining a central impingement region, and a plurality of channels extending through the one or more walls; and
a cover plate coupled to the fluid inlet surface of the manifold, the cover plate comprising a fluid inlet port fluidly coupled to the inlet channel of the manifold, and a fluid outlet port fluidly coupled to the fluid outlet of the manifold.

11. The cooling device of claim 10, wherein the plurality of channels of the heat sink is a plurality of bores extending through the one or more walls.

12. The cooling device of claim 10, wherein the plurality of channels of the heat sink is a plurality of open grooves through the one or more walls.

13. The cooling device of claim 10, wherein the target surface and the heat sink have a porous surface.

14. The cooling device of claim 10, wherein:
the jet region is defined by a perimeter wall; and
the perimeter wall has a non-linear shape comprising a plurality of convex regions, where each convex region is adjacent to an individual jet orifice of the plurality of jet orifices.

15. The cooling device of claim 10, wherein:
the fluid inlet surface further comprises an additional jet region, the additional jet region comprising an additional plurality of jet orifices and an additional plurality of surface features extending from the fluid inlet surface;
an individual surface feature of the additional plurality of surface features is positioned adjacent an individual jet orifice of the additional plurality of jet orifices;
the jet region and the additional jet region are symmetrical about a line disposed in a center of the inlet channel; and
the target plate comprises an additional heat sink at the target surface, the additional heat sink comprising an additional one or more walls defining an additional central impingement region, and an additional plurality of channels through the additional one or more walls.

16. The cooling device of claim 15, wherein the jet region and the additional jet region are fluidly coupled to an end of the inlet channel.

17. The cooling device of claim 15, wherein the inlet channel comprises a ninety degree turn.

18. An electronic device assembly comprising:
a manifold comprising a fluid inlet surface, a fluid outlet surface defining an outlet manifold, and a fluid outlet, wherein:
the fluid outlet surface is opposite the fluid inlet surface;
the fluid inlet surface comprises an inlet channel fluidly coupled to a first jet region and a second jet region;
the first jet region and the second jet region each comprise a plurality of jet orifices and a plurality of surface features extending from the fluid inlet surface;
an individual surface feature of the plurality of surface features is positioned adjacent an individual jet orifice of the plurality of jet orifices;
the first jet region and the second jet region are symmetrical about a line disposed in a center of the inlet channel; and
the fluid outlet is fluidly coupled to the outlet manifold;
a target plate coupled to the fluid outlet surface of the manifold, the target plate comprising a heat receiving surface, a target surface, a first heat sink at the target surface, and a second heat sink at the target surface, wherein the first heat sink is aligned with the first jet region of the manifold, and the second heat sink is aligned with the second jet region;
a cover plate coupled to the fluid inlet surface of the manifold, the cover plate comprising a fluid inlet port fluidly coupled to the inlet channel of the manifold, and a fluid outlet port fluidly coupled to the fluid outlet of the manifold; and
a first electronic device and a second electronic device, wherein the first electronic device and the second electronic device are thermally coupled to the heat receiving surface such that the first electronic device and the second electronic device are opposite the first heat sink and the second heat sink, respectively.

19. The electronic device assembly of claim 18, wherein:
each of the first jet region and the second jet region is defined by a perimeter wall; and
the perimeter wall has a non-linear shape comprising a plurality of convex regions such that each convex region is adjacent to an individual jet orifice of the plurality of jet orifices.

20. The electronic device assembly of claim 18, wherein the inlet channel comprises a ninety degree turn.

* * * * *